US012666876B2

(12) United States Patent
Imaji

(10) Patent No.: US 12,666,876 B2
(45) Date of Patent: Jun. 23, 2026

(54) TRANSPARENT CONDUCTIVE PIEZOELECTRIC FILM AND TOUCH PANEL

(71) Applicant: KUREHA CORPORATION, Tokyo (JP)

(72) Inventor: Makoto Imaji, Tokyo (JP)

(73) Assignee: KUREHA CORPORATION, Tokyo (JP)

( * ) Notice: Subject to any disclaimer, the term of this patent is extended or adjusted under 35 U.S.C. 154(b) by 707 days.

(21) Appl. No.: 18/250,483

(22) PCT Filed: Oct. 18, 2021

(86) PCT No.: PCT/JP2021/038368
§ 371 (c)(1),
(2) Date: Apr. 25, 2023

(87) PCT Pub. No.: WO2022/091829
PCT Pub. Date: May 5, 2022

(65) Prior Publication Data
US 2023/0422628 A1 Dec. 28, 2023

(30) Foreign Application Priority Data
Oct. 30, 2020 (JP) ................................. 2020-183104

(51) Int. Cl.
*H10N 30/857* (2023.01)
*G06F 3/044* (2006.01)
(Continued)
(52) U.S. Cl.
CPC ........... *H10N 30/857* (2023.02); *H10N 30/07* (2023.02); *H10N 30/302* (2023.02);
(Continued)

(58) Field of Classification Search
CPC .... H10N 30/857; H10N 30/07; H10N 30/302; H10N 30/878; H10N 30/883;
(Continued)

(56) References Cited

U.S. PATENT DOCUMENTS

2014/0152618 A1 6/2014 Ando
2015/0015120 A1 1/2015 Kaimori et al.
(Continued)

FOREIGN PATENT DOCUMENTS

CN 104094428 A 10/2014
CN 111699564 A 9/2020
(Continued)

OTHER PUBLICATIONS

Office Action for KR1020237013772, dated Jul. 26, 2024, 3 pages.
(Continued)

*Primary Examiner* — Jorge L Salazar, Jr.
(74) *Attorney, Agent, or Firm* — Abel Schillinger, LLP

(57) ABSTRACT

To suppress change in a surface resistance value under a high-temperature or high-humidity environment in a transparent conductive piezoelectric film including a transparent piezoelectric film made of a fluororesin. A transparent conductive piezoelectric film includes a transparent piezoelectric film made of a fluororesin, a transparent coating layer, and a transparent electrode stacked in this order. The total thickness of the coating layer is 0.6 to 4.5 μm. When the transparent conductive piezoelectric film is left to stand in a specific high-temperature environment, the ratio of a resistance value after being left in the environment to a ratio of a resistance value before being left in the environment is 1.30 or less.

10 Claims, 2 Drawing Sheets

(51) Int. Cl.

| | | |
|---|---|---|
| *H10N 30/07* | (2023.01) |
| *H10N 30/30* | (2023.01) |
| *H10N 30/87* | (2023.01) |
| *H10N 30/88* | (2023.01) |

(52) U.S. Cl.
CPC ......... *H10N 30/878* (2023.02); *H10N 30/883* (2023.02); *G06F 3/044* (2013.01); *G06F 2203/04103* (2013.01); *G06F 2203/04105* (2013.01)

(58) Field of Classification Search
CPC ........ H10N 30/02; H10N 30/06; H10N 30/87; H10N 30/098; H10N 30/30; H10N 30/88; G06F 3/044; G06F 2203/04103; G06F 2203/04105; G06F 3/041; B32B 27/08; B32B 2250/24; B32B 2307/308; B32B 2307/412; B32B 27/304; B32B 2255/10; B32B 2255/20; B32B 2255/26; B32B 2255/28; B32B 2307/202; B32B 2457/208; B32B 7/12; B32B 27/308; B32B 27/325; B32B 27/36; B32B 27/365; C08J 2327/16; C08J 2433/08; C08J 2433/12; C08J 7/0423; C08J 7/046; C09D 133/08; C09D 133/06; C23C 14/086; C23C 14/08; C23C 14/34
USPC .......................... 333/186–188; 310/311, 338
See application file for complete search history.

(56) References Cited

U.S. PATENT DOCUMENTS

| | | | | |
|---|---|---|---|---|
| 2015/0349746 A1* | 12/2015 | Yamazaki | ............ | H03H 9/1035 310/370 |
| 2016/0109983 A1 | 4/2016 | Ando | | |
| 2016/0126924 A1* | 5/2016 | Nakagawa | ............... | H03H 9/21 310/370 |
| 2016/0238466 A1 | 8/2016 | Tanimoto et al. | | |
| 2017/0218117 A1 | 8/2017 | Tanimoto et al. | | |
| 2019/0368027 A1 | 12/2019 | Dono et al. | | |
| 2021/0367137 A1 | 11/2021 | Sato et al. | | |

FOREIGN PATENT DOCUMENTS

| | | | |
|---|---|---|---|
| JP | 2007-059360 | A | 3/2007 |
| JP | 2007-134293 | A | 5/2007 |
| JP | 2008-152767 | A | 7/2008 |
| JP | 2010-108490 | A | 5/2010 |
| JP | 2012-79257 | A | 4/2012 |
| JP | 2015188055 | A | 10/2015 |
| JP | 2019016446 | A | 1/2019 |
| JP | 2019-96680 | A | 6/2019 |
| TW | 201523640 | A | 6/2015 |
| TW | 201528084 | A | 7/2015 |
| TW | 201816806 | A | 5/2018 |
| WO | 2013/021835 | A1 | 2/2013 |
| WO | 2017209081 | A1 | 12/2017 |

OTHER PUBLICATIONS

English translation of Office Action for KR1020237013772, dated Jul. 26, 2024, 3 pages.
Office Action for TW Application No. 110139603, dated Mar. 29, 2023, 7 pages.
English translation of the Office Action for TW Application No. 110139603, dated Mar. 29, 2023, 5 pages.
Office Action for TW Application No. 110139603, dated Aug. 24, 2022, 8 pages.
English translation of the Office Action for TW Application No. 110139603, dated Aug. 24, 2022, 6 pages.
Office Action for CN202180069517.4, dated Nov. 1, 2025, 7 pages.
English translation of Office Action for CN202180069517.4, dated Nov. 1, 2025, 11 pages.
Extended European Search Report for EP21885948.6, dated Mar. 15, 2024, 13 pages.
Ahmed Naser M. et al: "The effect of post annealing temperature on grain size of indium-tin-oxide for optical and electrical properties improvement", Results in Physics, vol. 13, Jun. 1, 20'19 (Jun. 1, 2019), p. 102'159, XP093136216, NL ISSN: 2211-3797, DOI:'1 0.1 01 6/j.rinp.201 9.1 021 59.
English translation of the International Preliminary Report on Patentability for PCT/JP2021/038368, mailed May 11, 2023, 6 pages.
Office Action for CN202180069517.4, dated Apr. 2, 2026, 5 pages.
English translation of Office Action for CN202180069517.4, dated Apr. 2, 2026, 7 pages.

\* cited by examiner

[FIG. 1]
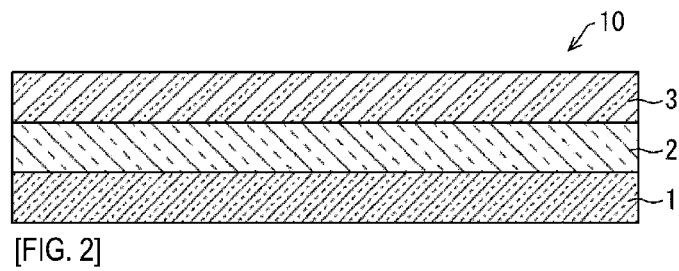
[FIG. 2]
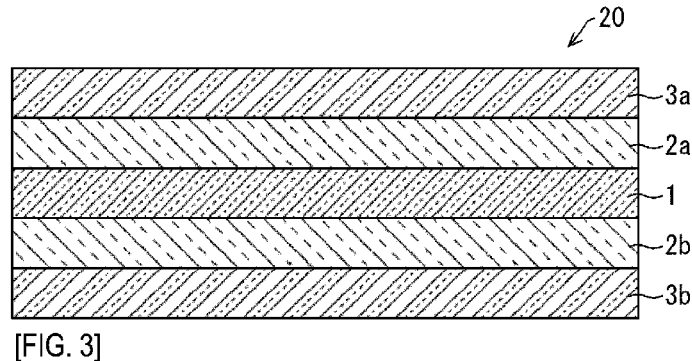
[FIG. 3]
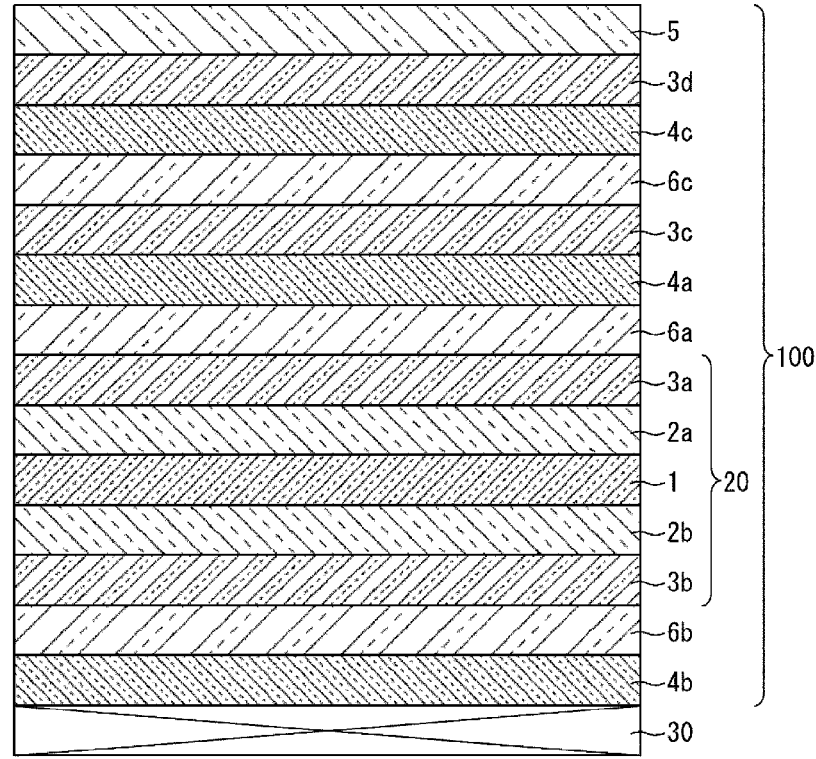

[FIG. 4]
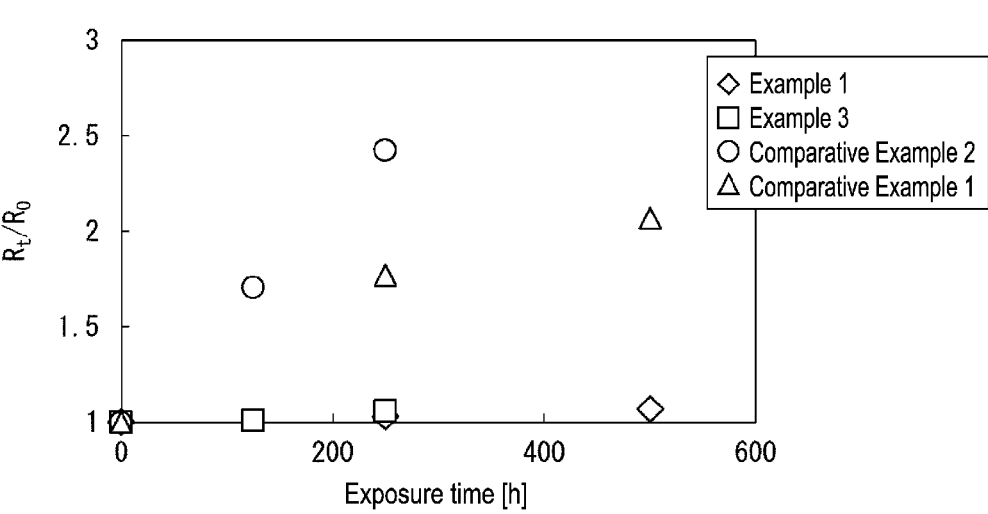

TRANSPARENT CONDUCTIVE PIEZOELECTRIC FILM AND TOUCH PANEL

TECHNICAL FIELD

The present invention relates to a transparent conductive piezoelectric film and a touch panel.

BACKGROUND ART

A transparent conductive piezoelectric film generates electricity according to pressure so that a position at which the pressure is applied can be identified. Accordingly, a transparent conductive piezoelectric film can be used for a pressure-sensitive sensor of a touch panel. In the related art, various touch panels that simultaneously perform touch position detection and press detection have been devised. As such a touch panel, there is known a touch panel having a configuration in which a pressure sensor unit that detects pressure is superimposed on an electrostatic touch panel unit that detects a touch position (e.g., refer to Patent Document 1).

The touch panel includes a combination of a capacitive touch sensor and the pressure-sensitive sensor. A polyethylene terephthalate (PET) film is usually used for the capacitive touch sensor. As a capacitive touch panel sensor, a transparent conductive film including a transparent plastic substrate is known (e.g., refer to Patent Documents 2 and 3). In addition, a touch panel using a fluorine-based resin as a transparent piezoelectric sheet is known (e.g., refer to Patent Document 4).

CITATION LIST

Patent Literature

Patent Document 1: WO 2013/021835
Patent Document 2: JP 2008-152767 A
Patent Document 3: JP 2007-059360 A
Patent Document 4: JP 2010-108490 A

SUMMARY OF INVENTION

Technical Problem

Research into transparent conductive piezoelectric films has found that in a transparent conductive piezoelectric film in which a transparent electrode is stacked on a piezoelectric film, the resistance value of the transparent electrode tends to increase with an increase in temperature. Therefore, in a touch panel that uses a transparent conductive piezoelectric film, when the touch panel is exposed to a high-temperature environment, the resistance value of the transparent conductive piezoelectric film may change, resulting in accurate input information not being obtained.

An object of one aspect of the present invention is to suppress change in a surface resistance value under a high-temperature environment in a transparent conductive piezoelectric film including a transparent piezoelectric film made of a fluororesin.

Solution to Problem

In order to solve the above problems, a transparent conductive piezoelectric film according to an aspect of the present invention includes, by sequentially stacking, a transparent piezoelectric film made of a fluororesin, a transparent coating layer, and a transparent electrode layer, wherein a total thickness of the coating layer is 0.6 to 4.5 μm, and when the transparent conductive piezoelectric film is left in an environment of 85° C. for 250 hours, a ratio of a surface resistance value after being left in the environment to a surface resistance value before being left in the environment is 1.30 or less.

In addition, in order to solve the above problem, a method for manufacturing a transparent conductive piezoelectric film according to an aspect of the present invention includes a step of forming a transparent coating layer having a total thickness of 0.6 to 4.5 μm on at least one surface of a transparent piezoelectric film made of a fluororesin, and a step of forming a transparent electrode on a surface of the transparent coating layer.

In addition, in order to solve the above problem, a touch panel according to an aspect of the present invention includes the above transparent conductive piezoelectric film.

Advantageous Effects of Invention

According to one aspect of the present invention, in a transparent conductive piezoelectric film including a transparent piezoelectric film made of a fluororesin, change in a surface resistance value under a high-temperature environment can be suppressed.

BRIEF DESCRIPTION OF THE DRAWINGS

FIG. 1 is a diagram schematically illustrating a layer configuration of a transparent conductive piezoelectric film according to an embodiment of the present invention.

FIG. 2 is a diagram schematically illustrating a layer configuration of a transparent conductive piezoelectric film according to another embodiment of the present invention.

FIG. 3 is a diagram schematically illustrating a layer configuration of a touch panel according to an embodiment of the present invention.

FIG. 4 is a graph showing the influence of a high-temperature and high-humidity environment on a surface resistance value over time in Examples and Comparative Examples of the present invention.

DESCRIPTION OF EMBODIMENTS

Configuration

A transparent conductive piezoelectric film (transparent piezoelectric laminated film) according to an embodiment of the present invention includes a transparent piezoelectric film, a transparent coating layer, and a transparent electrode stacked in this order. In the present embodiment, "stacked in this order" means a state in which the above-described film, layer, and electrode (hereinafter, also referred to as "layer or the like") are arranged in the listed order in a laminate including the film and the layer. The above-described film and layer may be stacked in contact with each other or may be stacked with another film or layer interposed therebetween, provided that the effects of the present embodiment are achieved.

Transparent Piezoelectric Film

The transparent piezoelectric film in the present embodiment is made of a fluororesin. In the present embodiment, "made of a fluororesin" means that a fluororesin is the main component in the composition constituting the transparent piezoelectric film, and "fluororesin is the main component" means that fluororesin is the largest component in the resin component in the composition. The content of the fluororesin in the composition may be 51 mass % or more, 80 mass % or more, or 100 mass %.

The term "piezoelectric film" means a film having piezoelectric properties. In addition, in the present embodiment, the term "transparent" means an optical characteristic of transmitting visible light at a desired ratio or higher according to the application of the transparent conductive piezoelectric film. For example, when the transparent conductive piezoelectric film is used in a touch panel, "transparent" means that the total light transmittance is 80% or more.

The fluororesin in the present embodiment may be any fluororesin that can be used in a piezoelectric film, and may be one kind of fluororesin or multiple kinds of fluororesin. Examples of the fluororesin include a vinylidene fluoride resin, a tetrafluoroethylene resin, and a mixture thereof.

Examples of the vinylidene fluoride resin include a homopolymer of vinylidene fluoride and a copolymer thereof. The content of the structural unit derived from a monomer other than vinylidene fluoride in the copolymer of vinylidene fluoride may be appropriately determined within a range in which characteristics specific to the application of the transparent piezoelectric film can be obtained.

Examples of monomers other than vinylidene fluoride in the copolymer of vinylidene fluoride include hydrocarbon monomers and fluorine compounds. Examples of the hydrocarbon monomer include ethylene and propylene. The fluorine compound is a fluorine compound other than vinylidene fluoride and a fluorine compound having a polymerizable structure. Examples of the fluorine compound include vinyl fluoride, trifluoroethylene, trifluorochloroethylene, tetrafluoroethylene, hexafluoropropylene, and fluoroalkyl vinyl ether.

Examples of the tetrafluoroethylene resin include a homopolymer of tetrafluoroethylene and a copolymer thereof. Examples of the monomer other than tetrafluoroethylene constituting the structural unit of the copolymer include ethylene, fluoropropylene, fluoroalkyl vinyl ether, perfluoroalkyl vinyl ether, and perfluorodioxole.

In a case where the fluororesin in the present embodiment is a copolymer, the content of the structural unit derived from vinylidene fluoride in the fluororesin can be appropriately set within a range in which the effects of the present embodiment can be achieved. From this viewpoint, the content is preferably 20 mass % or more, more preferably 40 mass % or more, and even more preferably 60 mass % or more.

The transparent piezoelectric film in the present embodiment may contain various additives as long as the effect of the present embodiment can be achieved. The additive may be one kind of additive or multiple kinds of additives, and examples thereof include a plasticizer, a lubricant, a crosslinking agent, a UV absorber, a pH controlling agent, a stabilizer, an antioxidant, a surfactant, and a pigment.

The thickness of the transparent piezoelectric film in the present embodiment can be appropriately set from a range in which the effect of the present embodiment can be achieved according to the application of the transparent conductive piezoelectric film. When the thickness of the transparent piezoelectric film is too thin, the mechanical strength of the film may be insufficient, and when the thickness is too thick, the effect of the film may plateau or the transparency of the film may be insufficient, and it may be difficult to use the transparent piezoelectric film in optical applications. The thickness of the transparent piezoelectric film can be appropriately set within a range of 10 to 200 μm, for example.

More specifically, the thickness of the transparent piezoelectric film is preferably 10 μm or more, more preferably 20

μm or more, and even more preferably 30 μm or more from the viewpoint of mechanical strength. Furthermore, the thickness of the transparent piezoelectric film is preferably 200 μm or less, more preferably 150 μm or less, and even more preferably 100 μm or less from the viewpoint of achieving both mechanical strength and economic efficiency. The transparent conductive piezoelectric film, which is a transparent piezoelectric film having a thickness within the above-described range, can be suitably used for a touch panel.

The piezoelectric characteristics of the transparent piezoelectric film in the present embodiment can be appropriately set from a range in which the effects of the present embodiment can be achieved according to the application of the transparent conductive piezoelectric film. If the piezoelectric characteristics are too low, functionality as a piezoelectric material may be insufficient. From the viewpoint of achieving sufficient piezoelectric characteristics, when the transparent conductive piezoelectric film is a touch panel, for example, the piezoelectric characteristics of the transparent piezoelectric film have a piezoelectric constant $d_{33}$ of preferably 6 pC/N or more, more preferably 10 pC/N or more, and even more preferably 12 pC/N or more. The upper limit of the piezoelectric characteristics is not limited, but in the above case, the piezoelectric constant $d_{33}$ may be 30 pC/N or less from the viewpoint of sufficiently obtaining the desired effect.

The transparent piezoelectric film in the present embodiment can be produced by, for example, subjecting a fluororesin sheet as described in Examples to stretching and polarization treatment.

Transparent Coating Layer

The transparent coating layer in the present embodiment is located between the transparent piezoelectric film and the transparent electrode. The transparent coating layer may be a layer that is transparent and has sufficient dimensional stability to suppress deformation of the transparent piezoelectric film in a plane direction. In addition, the transparent coating layer is preferably a layer that has inertness that does not substantially affect the optical characteristics of the transparent piezoelectric film, from the viewpoint of suppressing discoloration of the transparent piezoelectric film.

The transparent coating layer may be disposed on only one surface side of the transparent piezoelectric film, or may be disposed on both surface sides of the transparent piezoelectric film from the viewpoint of sufficiently suppressing deformation of the transparent piezoelectric film caused by the environment. The transparent coating layer is preferably disposed adjacent to the transparent piezoelectric film in the thickness direction of the transparent conductive piezoelectric film from the viewpoint of improving the transparency of the transparent conductive piezoelectric film and the viewpoint of preventing color development of the transparent piezoelectric film due to the environment.

The transparent coating layer may be a single layer or may be composed of two or more stacked layers. In the present embodiment, the transparent coating layer may be any layer that is disposed between the transparent piezoelectric film and the transparent electrode and contributes to the dimensional stability of the transparent piezoelectric film. When the transparent coating layer is composed of two or more layers, some or all of the layers may further have a property other than the property of imparting dimensional stability to the transparent piezoelectric film, such as adjusting optical properties, as long as the effects of the present embodiment can be achieved.

The total thickness of the transparent coating layer in the present embodiment is 0.6 to 4.5 μm. In the present embodiment, the "total thickness" of the transparent coating layer is the sum of thicknesses of individual transparent coating layers included in the transparent conductive piezoelectric film. When the transparent coating layer is provided only on one main surface side of the transparent piezoelectric film, the total thickness is the thickness of the transparent coating layer on the one main surface side. When the transparent piezoelectric film includes the transparent coating layer on both surfaces of one main surface and another main surface, the total thickness is the sum of the thickness of the transparent coating layer on the one main surface side and the thickness of the transparent coating layer on the other main surface side. When the transparent coating layer is too thin, suppression of the deformation of the transparent piezoelectric film caused by the environment may be insufficient. When the transparent coating layer is too thick, the piezoelectric properties of the transparent conductive piezoelectric film may be insufficient.

The total thickness of the transparent coating layer is preferably 0.6 μm or more, more preferably 0.8 μm or more, and even more preferably 1.0 μm or more, from the viewpoint of sufficiently suppressing the deformation of the transparent piezoelectric film caused by the environment. In addition, the total thickness of the transparent coating layer is preferably 4.0 μm or less, more preferably 3.6 μm or less, and still more preferably 3.2 μm or less, from the viewpoint of sufficiently reflecting the piezoelectric characteristics of the transparent piezoelectric film.

When the transparent piezoelectric film includes a plurality of transparent coating layers, the thickness of each transparent coating layer is preferably 0.3 μm or more from the viewpoint of sufficiently suppressing thermal shrinkage of the transparent piezoelectric film.

The transparent coating layer may be a transparent surface protective layer for scratch prevention, also known as a hard coat layer. The material of the transparent coating layer can be selected from any material that can be used for a piezoelectric film as long as it has the above transparency and the above inertness with respect to the transparent piezoelectric film. The material may be an inorganic material or an organic material, and one or more kinds thereof may be used. Further, the material of the coating layer may be the material of the hard coat layer. Examples of the material include a melamine resin, a urethane resin, a (meth)acrylic acid ester resin, a silane compound, and a metal oxide. The term "(meth)acrylic acid" is a generic term for acrylic acid and methacrylic acid, and means one or both of them.

It is preferable that the material of the transparent coating layer be a (meth)acrylic acid ester resin, that is, the transparent coating layer be made of a (meth)acrylic acid ester resin because (meth)acrylic acid ester resin has sufficient transparency, a larger number of types of materials can be used, and raw material cost is low. The material of the transparent coating layer may include other materials required to form the transparent coating layer. As a material for a transparent coating layer made of a (meth)acrylic acid ester resin, a composition obtained by mixing an initiator, an oligomer, a monomer, and other components may be generally used. In this case, the physical properties of the transparent coating layer are mainly determined by the oligomer and the monomer. Examples of the oligomer include a monofunctional or a polyfunctional (meth)acrylate. Examples of the monomer include urethane (meth) acrylate, epoxy (meth)acrylate, and polyester (meth)acrylate.

The transparent coating layer may have various functions within a range in which the effect of the present embodiment is achieved. The material of the transparent coating layer may further contain a material for achieving an optional function as another component. Examples of such a material include an optical modifier for controlling the refractive index of the transparent coating layer, and an antistatic agent. Examples of the optical modifier include hollow silica-based fine particles, a silane coupling agent, silicon oxide, aluminum oxide, titanium oxide, zirconium oxide, zinc oxide, and tin oxide. Examples of the antistatic agent include a surfactant, antimony pentoxide, indium-tin composite oxide (ITO), and conductive polymers. On the other hand, the transparent coating layer may not contain other components from the viewpoint of enhancing the transparency of the transparent coating layer.

Transparent Electrode

The transparent electrode in the present embodiment has a structure having a planar spread and conductivity, and can also be referred to as a transparent conductive layer. When the planar spread is assumed to be one layer, the transparent electrode only needs to achieve sufficient transparency, and in such a structure, the transparent electrode itself does not need to have transparency. For example, the transparent electrode may be formed of a conductive member or composition having high transparency, or may be formed of a material having no transparency but having an ultra-thin or ultra-fine structure capable of exhibiting sufficient transparency.

The transparent electrode may be formed on a transparent substrate and bonded to the transparent coating layer together with the substrate, or may be directly formed on the surface of the transparent coating layer or another layer adjacent to the transparent coating layer in the layer configuration of the touch panel described later. The transparent electrode may be disposed on at least one surface side of the transparent piezoelectric film. When the transparent coating layer is formed on both surface sides of the transparent piezoelectric film, the transparent electrode may be disposed on at least one of the transparent coating layers. The form of the transparent electrode is not limited, and may be a nanowire, a mesh, or a thin film. The thin film may have a single-layer structure or a stacked-layer structure including a plurality of layers.

The material forming the transparent electrode is not limited, and metal oxides of at least one metal selected from the group consisting of In, Sn, Zn, Ga, Sb, Ti, Si, Zr, Mg, Al, Au, Ag, Cu, Pd, and W are preferably used. The metal oxide may further contain a metal atom selected from the group described above, if necessary. As the metal oxide, an oxide such as ITO or antimony-tin composite oxide (ATO) is preferably used, and ITO is particularly preferably used. Examples of other representative materials for the transparent electrode 4 include silver nanowires, silver mesh, copper mesh, graphene, and carbon nanotubes.

The thickness of the transparent electrode is not limited, and is preferably 10 nm or more from the viewpoint of forming a continuous film having good conductivity with a surface resistance value of $1 \times 10^3$ Ω/sq or less. When the thickness is too large, the transparency may decrease, and when the thickness is too small, the electrical resistance may increase and a discontinuous portion may be formed in the film structure. The thickness is preferably 15 nm or more, more preferably 20 nm or more, from the viewpoint of further increasing conductivity. On the other hand, from the viewpoint of further increasing the transparency of the transparent electrode, the thickness of the transparent electrode is preferably less than 55 nm, and more preferably less than 45 nm. The thickness of the transparent electrode can be determined by a known method based on observation of a cross-section of such a laminate.

A method for forming the transparent electrode is not limited, and the transparent electrode can be formed by adopting a known method in the related art. Specific examples of such methods include a vacuum deposition method, a sputtering method, and an ion plating method. Any other appropriate method may be employed depending on the required film thickness.

Further, the transparent electrode does not need to be subjected to a heat annealing treatment after formation to crystallize the amorphous transparent electrode material. For example, the material of the transparent electrode in the present embodiment is preferably amorphous from the viewpoint of facilitating etching for patterning the transparent electrode. The fact that the transparent electrode is made of an amorphous material can be confirmed when, for example, an X-ray diffraction method does not detect a crystal peak in the material of the transparent electrode.

The amorphous property in the transparent electrode can be determined using an X-ray diffraction method as described above. The amorphous property can be adjusted by the presence or absence and the degree of implementation of a step of promoting crystallization in the preparation of the transparent electrode, such as annealing after forming the transparent electrode.

Other Layer Configurations

The transparent conductive piezoelectric film of the present embodiment may further have a configuration other than that described above, as long as the effect of the present embodiment is obtained. Such other configurations may be used singularly or in conjunction, and examples thereof include a transparent adhesive layer and a peelable release layer that is in contact with the transparent adhesive layer.

The transparent adhesive layer is a transparent layer having adhesiveness that achieves bonding between an optional layer constituting the transparent conductive piezoelectric film or the touch panel described below and another layer. The transparent adhesive layer may be an adhesive having transparency. Such a transparent adhesive may contain a base polymer that exhibits transparency and adhesiveness. Examples of the base polymer include an acrylic polymer, a silicone-based polymer, polyester, polyurethane, polyamide, polyvinyl ether, a vinyl acetate/vinyl chloride copolymer, modified polyolefin, an epoxy-based polymer, a fluorine-based polymer, and a rubber-based polymer. Examples of the rubber-based polymer include natural rubber and synthetic rubber. The base polymer can be appropriately selected from the above-mentioned examples. As the transparent adhesive, in particular, an acrylic adhesive is preferably used from the viewpoint of having excellent optical transparency, exhibiting adhesive characteristics such as appropriate wettability, cohesiveness, and adhesiveness, and also having excellent weather resistance and heat resistance.

The thickness of each layer constituting the transparent conductive piezoelectric film can be measured by embedding the transparent conductive piezoelectric film in an epoxy resin, cutting the epoxy resin mass to expose a cross-section of the transparent conductive piezoelectric film, and observing the cross-section with a scanning electron microscope. The thickness of the layer may be a representative value of thicknesses of the layer, or may be an average value of a plurality of any measured values, a maximum value of the measured values, or a minimum value of the measured values.

Physical Properties

When the transparent conductive piezoelectric film of the present embodiment is left to stand in an environment of 85° C. for 250 hours, the ratio of the surface resistance value after being left in the environment to the surface resistance value before being left in the environment is 1.30 or less. The fluororesin constituting the transparent piezoelectric film generally has higher thermal shrinkability than a resin film formed by biaxial stretching, such as PET, which is generally used in this technical field. Therefore, the transparent piezoelectric film is likely to expand and contract in a high-temperature environment. When the ratio of the surface resistance values of the transparent conductive piezoelectric film is 1.30 or less, deformation of the transparent piezoelectric film in the transparent conductive piezoelectric film is sufficiently suppressed in a case where the transparent conductive piezoelectric film is placed even temporarily in a high-temperature environment. Accordingly, peeling of the transparent electrode due to deformation of the transparent piezoelectric film is prevented, and a change in resistance value in the transparent conductive piezoelectric film is sufficiently suppressed.

From the viewpoint of further suppressing change in the resistance value of the transparent conductive piezoelectric film due to the deformation of the transparent piezoelectric film, the ratio of the surface resistance values is preferably 1.25 or less. From the same viewpoint, the ratio of the surface resistance values is preferably 0.75 or more, and more preferably 0.85 or more. The surface resistance value can be measured by a known method capable of measuring the surface resistance value of a resin film having conductivity. The surface resistance value can be adjusted according to the conductivity at the surface of the transparent conductive piezoelectric film.

It is preferable that the transparent conductive piezoelectric film of the present embodiment more directly have dimensional stability in a high-temperature environment from the viewpoint of suppressing change in the resistance value of the transparent conductive piezoelectric film caused by the environmental change. The dimensional stability in such a high-temperature environment can be measured by thermomechanical analysis (TMA). For example, a linear expansion coefficient of the transparent conductive piezoelectric film used in a pressure-sensitive sensor of a touch panel is preferably $310 \times 10^{-6}$ $K^{-1}$ or less and more preferably $300 \times 10^{-6}$ $K^{-1}$ or less in the vertical direction (TD direction) of the transparent piezoelectric film. The linear expansion coefficient can be measured by the known method described in JIS K7197-1991 using, for example, a thermomechanical analyzer. In addition, the linear expansion coefficient can be adjusted by using a material which does not easily thermally expand in the transparent conductive piezoelectric film, or by adopting a material or a structure that can relax stress caused by thermal expansion.

Production Method

A transparent conductive piezoelectric film according to the present embodiment can be manufactured by a method including a step of forming a transparent coating layer having a total thickness of 0.6 to 4.5 μm on at least one surface of a transparent piezoelectric film made of a fluororesin, and a step of forming a transparent electrode on a surface of the transparent coating layer.

The transparent conductive piezoelectric film of the present embodiment can be produced in the same way as a known transparent conductive piezoelectric film, except that the above-described transparent piezoelectric film is used and the above-described layer is formed. For example, the transparent conductive piezoelectric film may be produced by stacking a transparent piezoelectric film, a transparent coating layer, and a layer including a transparent electrode in this order. Alternatively, the transparent conductive piezoelectric film may be produced by forming a transparent coating layer on the surface of the transparent piezoelectric film and forming a transparent electrode on the surface of the transparent coating layer.

The transparent coating layer can be produced by performing a step of applying a coating material for forming the transparent coating layer to the transparent piezoelectric film and a step of solidifying the coating film formed in the applying step. The step of applying the coating material can be performed by a known coating method. Examples of the coating method include spray coating, roll coating, die coating, air knife coating, blade coating, spin coating, reverse coating, gravure coating, and vapor deposition. The thickness of the coating film can be appropriately adjusted based on the number of times the coating film is applied or the viscosity of the coating material.

The step of solidifying can be performed by a known method of solidifying the coating film of the coating material. Examples of the solidification method include drying, and curing by polymerization by heating or light irradiation. The coating material for the transparent coating layer may contain a polymer, may contain a monomer, or may contain both of these. In addition, in the coating material, the polymer may contain a crosslinked structure that causes curing, or may contain a low molecular weight compound having a plurality of crosslinked structures. Further, the coating material may contain, as appropriate and necessary, an additive for solidification, such as a polymerization initiator for causing the polymerization reaction.

Alternatively, the transparent coating layer may be produced simultaneously with the transparent piezoelectric film by co-extruding the transparent piezoelectric film and the transparent coating layer.

The transparent electrode can be prepared by coating the transparent coating layer with a coating material of the electrode material. Such coating can be carried out by a known coating method as described above. Alternatively, the transparent electrode can be produced on the transparent coating layer by sputtering. Further, the transparent electrode can be produced by a known method depending on the material and the form suited to the material.

For example, when an ITO film is formed as the transparent electrode, in the step of forming the transparent electrode, a thin film of ITO can be formed as the transparent electrode on the transparent coating layer by a reactive sputtering method using a sintered body containing indium oxide and tin oxide as a raw material. By performing this step, an amorphous ITO film can be formed at a low temperature. This is preferable from the viewpoint of facilitating etching for patterning the transparent electrode, saving energy in manufacturing, and suppressing thermal shrinkage of the transparent piezoelectric film in manufacturing the transparent conductive piezoelectric film.

The step of forming the transparent electrode is preferably performed in a lower temperature environment from the viewpoint of facilitating etching, which is usually performed in a subsequent step. From this viewpoint, the reactive sputtering is preferably performed at, for example, 80° C. or less. The above-described temperature in the reactive sputtering may be within the range of an increase in the system temperature due to the reaction heat. Therefore, although cooling for controlling the temperature to the above-mentioned temperature need not be actively performed, the temperature in the system may be actively controlled using a cooling device for removing the reaction heat.

The method for manufacturing the transparent conductive piezoelectric film may further include steps other than the above-described steps as long as the effects of the present embodiment can be achieved. In addition, the method for manufacturing the transparent conductive piezoelectric film may not include a specific step from the viewpoint of obtaining or further enhancing the effect of the present embodiment. For example, in the method for manufacturing, the annealing step for the transparent electrode on which the transparent electrode is formed is preferably not performed from the viewpoint of further facilitating patterning of the transparent electrode. In general, when forming a transparent electrode layer of ITO on a PET film, the ITO is sputtered on the PET, and then annealing treatment is performed at about 150° C. for about 60 to 90 minutes. In the present embodiment, patterning of the transparent electrode can be facilitated by not performing the heat treatment for causing the crystallization of ITO as described above.

Hereinafter, an embodiment of the present invention will be described with reference to the drawings. As illustrated in FIG. 1, a transparent conductive piezoelectric film 10 according to an embodiment of the present invention includes a transparent piezoelectric film 1, a transparent coating layer 2, and a transparent electrode 3 directly stacked in this order.

The transparent piezoelectric film 1 is made of a fluororesin as described above. The transparent coating layer 2 is made of, for example, the above-described (meth)acrylic acid ester resin, and is stacked on one surface of the transparent piezoelectric film 1. The transparent electrode 3 is, for example, an ITO layer, and is formed on the surface of the transparent coating layer 2 on a side opposite to the transparent piezoelectric film 1. The transparent conductive piezoelectric film 10 is used in a pressure-sensitive sensor such as a touch panel by being bonded to another component via the above-described transparent adhesive layer.

As illustrated in FIG. 2, a transparent conductive piezoelectric film 20 according to another embodiment of the present invention includes the transparent piezoelectric film 1, the transparent coating layer 2, and the transparent electrode 3 directly stacked in this order. In the transparent conductive piezoelectric film 20, the transparent coating layer 2 and the transparent electrode 3 are disposed on both sides of the transparent piezoelectric film 1.

That is, a transparent coating layer 2a is stacked on one surface of the transparent piezoelectric film 1, and a transparent coating layer 2b is stacked on the other surface of the transparent piezoelectric film 1. Further, a transparent electrode 3a is formed on the surface of the transparent coating layer 2a, and a transparent electrode 3b is formed on the surface of the transparent coating layer 2b. Similarly to the transparent conductive piezoelectric film 10, the transparent conductive piezoelectric film 20 is also used as a part of a laminated structure in a pressure-sensitive sensor such as a touch panel by bonding each of the transparent electrodes 3a and 3b to another layer.

Touch Panel

A touch panel according to one embodiment of the present invention includes the above-described transparent conductive piezoelectric film according to the present embodiment.

The location and quantity of the transparent conductive piezoelectric films in the touch panel can be appropriately set in accordance with the intended use or intended function of the touch panel. FIG. 3 is a view schematically illustrating an example of a layer configuration in the touch panel according to the embodiment of the present invention.

As illustrated in FIG. 3, the touch panel 100 has a configuration in which the transparent piezoelectric laminated film 20 illustrated in FIG. 2 is sandwiched between a transparent electrode 4b and a cover glass 5. Between the transparent piezoelectric laminated film 20 and the cover glass 5, a transparent substrate 6a, a transparent electrode 4a, a transparent adhesive layer 3c, a transparent substrate 6c, a transparent electrode 4c, and a transparent adhesive layer 3d are stacked in this order from the transparent piezoelectric laminated film 20 toward the cover glass 5. A transparent substrate 6b is disposed between the transparent piezoelectric laminated film 20 and the transparent electrode 4b. As described above, the touch panel 100 is configured by stacking the transparent electrode 4b, the transparent piezo-electric laminated film 20, and the cover glass 5 in this order. When the touch panel 100 is put into practical use, the surface of the touch panel 100 on the side of the transparent electrode 4b can be disposed overlapping the surface of the display 30, but no limitation is intended.

The transparent piezoelectric laminated film 20 and the cover glass 5 are bonded to each other by the transparent adhesive layer 3a with the transparent adhesive layers 3c and 3d, the transparent electrodes 4a and 4c, and the transparent substrates 6a and 6c interposed therebetween, and the transparent piezoelectric laminated film 20 and the transparent electrode 4b are bonded to each other by the transparent adhesive layer 3b with the transparent substrate 6b interposed therebetween. In addition, a display panel such as an organic EL display panel or a liquid crystal display panel, that is, the display 30 may be disposed on the opposite side of the transparent piezoelectric laminated film 20 in the stacking direction of the transparent electrode 4b. Since a known display panel in the related art can be employed as the display 30, a detailed description of the configuration of the display 30 will be omitted in the present specification.

The transparent electrodes 4a, 4b, and 4c may be formed on the transparent substrates 6a, 6b, and 6c, respectively, and bonded to desired layers in the touch panel 100 together with the transparent substrates 6a, 6b, and 6c. Alternatively, the transparent electrodes 4a, 4b, and 4c may be formed directly on the surfaces of other adjacent layers in the stacking direction and bonded by the transparent adhesive layers 3a, 3b, 3c, or 3d.

As the transparent electrodes 4a, 4b, and 4c, known transparent electrodes that can be used in a touch panel can be employed. More specifically, the transparent electrodes 4a, 4b, and 4c may be substantially transparent planar electrodes, may be conductive thin films having a pattern, or may have a planar structure formed of an extremely thin conductive wire. The material constituting the transparent electrodes 4a, 4b, and 4c is not limited, and metal oxides of at least one metal selected from the group consisting of In, Sn, Zn, Ga, Sb, Ti, Si, Zr, Mg, Al, Au, Ag, Cu, Pd, and W are preferably used. The metal oxide may further contain a metal atom selected from the group described above, if necessary. As the metal oxide, an oxide such as indium-tin composite oxide (ITO) or antimony-tin composite oxide (ATO) is preferably used, and ITO is particularly preferably used. Examples of other representative materials for the transparent electrodes 4a, 4b, and 4c include silver nanowire, silver mesh, copper mesh, graphene, and carbon nano-tube. For the transparent substrates 6a, 6b, and 6c, a known transparent film that can be used as a base for supporting the transparent electrodes 4a, 4b, and 4c can be employed. The material forming the transparent substrates 6a, 6b, and 6c is not limited, and polyethylene terephthalate (PET), polycarbonate (PC) and a cycloolefin polymer (COP) are preferably used.

The cover glass 5 is a cover glass for a touch panel. The cover glass need only be a sheet-like light transmitting member for a touch panel, and may be a glass plate such as the cover glass 5 or a transparent resin sheet.

The touch panel in the embodiment of the present invention may further include other components, as long as the effects of the present embodiment can be achieved.

In addition, the touch panel according to the embodiment of the invention may include the transparent conductive piezoelectric film according to the embodiment of the present invention in the laminated structure. The position of the transparent conductive piezoelectric film in the touch panel in the stacking direction may be appropriately set within a range in which the effect of the embodiment of the present invention can be achieved.

For example, the touch panel according to the embodiment of the present invention may have a configuration in which the transparent conductive piezoelectric film according to the present embodiment is appropriately added to a laminated structure in a known touch panel, such as a GFF type panel or a GF2 type panel. In this case, a transparent electrode layer used for detecting pressure and a position sensor used for detecting a position may be directly stacked on the transparent conductive piezoelectric film of the present embodiment, or may be bonded thereto via an adhesive layer. The touch panel having such a configuration can further exhibit a function derived from the transparent conductive piezoelectric film in addition to the functions of a known touch panel. For example, the touch panel can include both a position sensor and a pressure sensor in a transparent laminated structure.

Effect

As described above, the transparent conductive piezoelectric film according to the present embodiment includes the transparent piezoelectric film, the transparent coating layer, and the transparent electrode stacked in this order, and the transparent coating layer has a specific thickness. Therefore, it is possible to sufficiently suppress a change in a surface resistance value under a specific high-temperature and high-humidity environment.

A polyvinylidene fluoride (PVDF) film serving as a fluororesin has excellent piezoelectric characteristics. On the other hand, as described above, a piezoelectric film made of PVDF has higher thermal shrinkability than a film made of PET, which has been widely used as a transparent piezo-electric film in the related art. Therefore, the piezoelectric film made of PVDF tends to shrink in a high-temperature environment, which may change electrical characteristics such as a resistance value. In this regard, in the piezoelectric film made of PVDF, the tendency of the electrical characteristics to change due to the thermal shrinkage described above may be more significant than in a capacitive touch sensor including a film made of PET in the related art.

In the present embodiment, the transparent coating layer having a predetermined thickness is formed on the transparent piezoelectric film made of a fluororesin so that an increase in resistance of the transparent conductive piezoelectric film when stored in a high-temperature or high-humidity environment is suppressed.

It is presumed that the increase in resistance occurs because the transparent electrode made of ITO or the like cracks or the transparent piezoelectric film and the transparent electrode separate from each other due to thermal shrinkage of the transparent piezoelectric film. Such abnormalities in the layer structure due to cracking or peeling can be observed with a scanning electron microscope (SEM). In the present embodiment, an increase in resistance due to the environment is considered to be suppressed because the occurrence of abnormalities in the layer structure is sufficiently suppressed.

Furthermore, it is preferable that the transparent electrode be substantially amorphous from the viewpoint of facilitating etching of the transparent electrode.

Since the transparent conductive piezoelectric film of the present embodiment has transparency and stable electrical characteristics, in a touch panel, the transparent conductive piezoelectric film can be disposed adjacent to a capacitive touch panel in the stacking direction. Therefore, in the touch panel, it is possible to detect position and pressure with adjacent layer configurations. Accordingly, it is possible to provide a touch panel with a simpler configuration than known configurations.

The transparent conductive piezoelectric film of the present embodiment can be disposed as a transparent piezoelectric layer in a laminated structure.

Modification

The transparent coating layer may be formed to have a lattice-like pattern, for example, instead of being formed in a planar shape. In a case where the transparent coating layer is composed of a plurality of layers, some or all of the plurality of layers may have the above-described pattern. The patterns may be the same as or different from each other.

SUMMARY

As is clear from the above description, the transparent conductive piezoelectric film according to the embodiment of the present invention includes, by sequentially stacking, a transparent piezoelectric film made of a fluororesin, a transparent coating layer, and a transparent electrode, wherein a total thickness of the coating layer is 0.6 to 4.5 $\mu$m, and when the transparent conductive piezoelectric film is left in an environment of 85° C. for 250 hours, a ratio of a surface resistance value after being left in the environment to a surface resistance value before being left in the environment is 1.30 or less. In addition, the touch panel according to the embodiment of the present invention includes the transparent conductive piezoelectric film. Therefore, in both the transparent conductive piezoelectric film and the touch panel, it is possible to suppress change in the surface resistance value caused by a high-temperature environment, in the transparent conductive piezoelectric film including a transparent piezoelectric film made of a fluororesin.

The linear expansion coefficient obtained by thermomechanical analysis in the transparent conductive piezoelectric film according to the embodiment of the present invention is $310 \times 10^{-6}$ $K^{-1}$ or less, which is more effective from the viewpoint of enhancing dimensional stability under a high-temperature environment and suppressing change in the surface resistance value.

In the embodiment of the present invention, the transparent electrode is made of an indium-tin composite oxide, and a peak of the indium-tin composite oxide is not detected in X-ray diffraction, which is more effective from the viewpoint of easily etching the transparent electrode.

In the embodiment of the present invention, the transparent coating layer is made of a (meth)acrylic acid ester resin, which is more effective from the viewpoint of enhancing transparency, suppressing discoloration, and improving dimensional stability against environmental deformation.

A method for manufacturing a transparent conductive piezoelectric film according to an embodiment of the present invention includes a step of forming a transparent coating layer having a total thickness of 0.6 to 4.5 $\mu$m on at least one surface of a transparent piezoelectric film made of a fluororesin, and a step of forming a transparent electrode, in which when the transparent conductive piezoelectric film is left in an environment of 85° C. for 250 hours, a ratio of a surface resistance value of the transparent electrode after being left in the environment to a surface resistance value of the transparent electrode before being left in the environment is 1.30 or less. Therefore, the embodiment of the present invention can provide the transparent conductive piezoelectric film of the embodiment of the present invention capable suppressing a change in the surface resistance value under a high-temperature environment.

In an embodiment of the present invention, in the step of forming the transparent electrode, a thin film of indium-tin composite oxide as a transparent electrode is formed on the transparent coating layer, by a reactive sputtering method using a sintered body containing indium oxide and tin oxide as a raw material, which is more effective from the viewpoint of forming a transparent electrode that has high conductivity and is less likely to crack or peel off.

In the embodiment of the present invention, the reactive sputtering is performed at a temperature of 80° C. or less in the step of forming the transparent electrode, which is more effective from the viewpoint of easily etching the transparent electrode in the above-described method for manufacturing.

In addition, in the embodiment of the present invention, an annealing treatment for the transparent electrode formed in the step of forming the transparent electrode is not performed, which is more effective from the viewpoint of easily etching the transparent electrode in the above-described method for manufacturing.

The present invention is not limited to each embodiment described above, and may be variously altered within the scope indicated in the claims. Embodiments obtained by appropriately combining technical means disclosed in different embodiments are also included in the technical scope of the present invention.

EXAMPLES

Example 1

A resin film (thickness, 120 $\mu$m) molded from polyvinylidene fluoride (manufactured by KUREHA CORPORATION) having an inherent viscosity of 1.3 dl/g was passed through a preheating roll heated to a surface temperature of 110° C. Subsequently, the film having passed through a preheating roll was passed through a stretching roll heated to a surface temperature of 120° C., and stretched so that the stretching ratio was 4.2 times. After stretching, the film was subjected to a polarization treatment by being passed through polarization rolls to obtain a piezoelectric film. At that time, a polarization treatment was performed by applying a DC voltage while increasing the DC voltage from 0 kV to 13.5 kV. The film after the polarization treatment was further heat-treated at 130° C. for 1 minute to obtain a transparent piezoelectric film having a thickness of 40 μm.

Next, a hard coating agent ("TYAB-M101", manufactured by TOYOCHEM CO., LTD.) was applied to one surface (first main surface) of the transparent piezoelectric film with a bar coater, and dried at 80° C. for 2 minutes.

Next, the dried coating film of the hard coating agent was irradiated with UV at an integrated light amount of 400 mJ/cm$^2$ using the UV irradiation device CSOT-40 (available from GS Yuasa Corporation). Thus, a film having a transparent coating layer with a thickness of 2.0 μm was obtained.

Next, a 40 nm thick ITO film serving as a transparent conductive layer was formed on the transparent coating layer by a reactive sputtering method under the following conditions using a sintered material containing 90 mass % of indium oxide and 10 mass % of tin oxide as a target. In this way, a transparent conductive piezoelectric film was obtained without annealing the transparent electrode.
Conditions
Initial pressure: Ultimate vacuum of 7.0×10$^{-4}$ Pa or less
Type of feed gas: Ar, O$_2$
Pressure of supply gas: Ar:O$_2$=100:1

Example 2

A transparent conductive piezoelectric film was obtained in the same way as in Example 1 except that the thickness of the transparent coating layer was changed to 1.5 μm.

Example 3

A transparent conductive piezoelectric film was obtained in the same way as in Example 1 except that the thickness of the transparent coating layer was changed to 1.0 μm.

Example 4

The DC voltage in the polarization treatment of the polyvinylidene fluoride resin film in Example 1 was changed to 11.8 kV. As the hard coating agent, "BS CH271" (manufactured by Arakawa Chemical Industries, Ltd.) was used instead of "TYAB-M101" (manufactured by TOYOCHEM CO., LTD.). Further, a transparent coating layer having a thickness of 0.4 μm was formed on the first main surface of the transparent piezoelectric film, and a transparent coating layer having a thickness of 0.4 μm was formed on the other surface (second main surface) of the transparent piezoelectric film. Further, an ITO film was formed on the surface of the transparent coating layer on the first main surface side in the same way as in Example 1 to obtain a transparent conductive piezoelectric film.

Example 5

A transparent conductive piezoelectric film was obtained in the same way as in Example 4 except that the thickness of each of the transparent coating layers on the first main surface and the second main surface was changed to 0.7 μm.

Example 6

A transparent conductive piezoelectric film was obtained in the same way as in Example 4 except that a transparent coating layer having a thickness of 1.0 μm was formed on the first main surface and a transparent coating layer having a thickness of 0.9 μm was formed on the second main surface.

Example 7

A transparent conductive piezoelectric film was obtained in the same way as in Example 4 except that a transparent coating layer having a thickness of 1.9 μm was formed on the first main surface and a transparent coating layer having a thickness of 2.1 μm was formed on the second main surface.

Comparative Example 1

A transparent conductive piezoelectric film was obtained in the same way as in Example 1 except that the thickness of the transparent coating layer was changed to 0.4 μm.

Comparative Example 2

A transparent conductive piezoelectric film was obtained in the same way as in Example 1 except that an ITO film was formed on the transparent piezoelectric film without forming a transparent coating layer.
Evaluation
Thickness of Transparent Coating Layer
Each of the transparent conductive piezoelectric films of Examples 1 to 7 and Comparative Example 1 was embedded in an epoxy resin, and the epoxy resin mass was cut so that a cross-section of the transparent conductive piezoelectric film was exposed. The exposed cross-section of the transparent conductive piezoelectric film was observed using a scanning electron microscope ("SU3800", available from Hitachi High-Technologies Corporation) under the conditions of an acceleration voltage of 3.0 kV and a magnification of 50,000 times so as to measure the thickness of the transparent coating layer in the transparent conductive piezoelectric film.

In the measurement of the thickness of the transparent coating layer, the thicknesses at two portions of the transparent coating layer were measured, and the average value thereof was defined as the thickness of the transparent coating layer. Under the above observation conditions, the interface of the transparent coating layer was observed as substantially smooth lines, and the distance between the lines was measured in the measurement of the thickness of the transparent coating layer.
Thickness of Transparent Conductive Layer
The cross-section of each of the transparent conductive piezoelectric films of Examples 1 to 7, Comparative Example 1, and Comparative Example 2 was observed using a scanning electron microscope under the conditions of an acceleration voltage of 3.0 kV and a magnification of 50,000 times, and the thicknesses of two portions of each ITO film were measured. The average value of the obtained measured values was calculated and defined as the thickness of the transparent conductive layer.
Initial Adhesive Force
In the transparent conductive piezoelectric films of Examples 1 to 7 and Comparative Example 1, and Comparative Example 2, the adhesiveness of the ITO film serving as the transparent conductive layer was measured in accordance with ASTM test method D3359.
Linear Expansion Coefficient
For each of the transparent conductive piezoelectric films of Examples 1 to 7, Comparative Example 1, and Comparative Example 2, the linear expansion coefficient from room temperature (25° C.) to 85° C. in the vertical direction (TD direction) of the transparent piezoelectric film was measured in accordance with JIS K7197-1991. In the measurement of the linear expansion coefficient, a thermomechanical analyzer ("TMA8311", manufactured by Rigaku Corporation) was used, and the average linear expansion coefficient (CTE) was calculated using the following formula and defined as the linear expansion coefficient of the transparent conductive piezoelectric film. In the following formula, "$I_r$" represents the length of the sample at room temperature, "$I_1$" represents the length of the sample at a temperature $T_1$ (° C.), and "$I_2$" represents the length of the sample at a temperature $T_2$ (° C.). Further, "$t_1$" is 25° C. and "$t_2$" is 85° C.

$$CTE = \frac{1}{I_r} \times \frac{I_2 - I_1}{t_2 - t_1} \qquad \text{[Formula 1]}$$

When the linear expansion coefficient is $310 \times 10^{-6}$ $K^{-1}$ or less, it can be determined that there are no problems in practical use of the touch panel.

Surface Resistance Characteristics in High-Temperature Environment

Each of the transparent conductive piezoelectric films of Examples 1 to 7 and Comparative Example 1 and Comparative Example 2 was placed for 500 hours in a thermo-hygrostat ("Econas LH34 14M", manufactured by NAGANO SCIENCE Co., Ltd.) controlled to an 85° C. environment.

The surface resistance value of the transparent conductive piezoelectric film was measured before being the transparent conductive piezoelectric film was placed in the above atmosphere (0 hours) and after the transparent conductive piezoelectric film was placed in the above environment for t hours. The surface resistance value was measured using a resistivity meter ("LorestaGP MCP-T700", manufactured by Nittoseiko Analytech Co., Ltd.) in accordance with JIS K7194. The measurement was performed three times in total, and the average value of the three measurements was taken as a representative value. Then, the ratio $R_t/R_0$ of the surface resistance value ($R_t$) at the time t in the atmosphere to the surface resistance value ($R_0$) before being placed in the atmosphere was obtained. When the ratio ($R_{250}/R_0$) at 250 hours is 1.30 or less, it can be determined that there are no problems in practical use of the touch panel.

Piezoelectric Characteristics

The piezoelectric constant $d_{33}$ of each of the transparent conductive piezoelectric films of Examples 1 to 7, Comparative Example 1 and Comparative Example 2 was measured by using a piezoelectric constant measuring device ("Piezometer System PM300", manufactured by Piezotest Pte Ltd) by clipping a sample at 0.2 N and reading the generated charge when a force of 0.15 N and 110 Hz was applied. Although the measured value of the piezoelectric constant $d_{33}$ is a positive value or a negative value depending on whether the front or back of the film is to be measured, the absolute value is described herein. It was confirmed that $d_{33}$ of any of the transparent conductive piezoelectric films was within a range of 6.0 to 30, and that the transparent conductive piezoelectric films had practically sufficient piezoelectric characteristics for use in a touch panel.

Diffraction Peak Derived from ITO

For each of the transparent conductive piezoelectric films of Examples 1 to 7, Comparative Example 1 and Comparative Example 2, the presence or absence of a diffraction peak derived from ITO in X-ray diffraction of the ITO film was measured. The presence or absence of the diffraction peak was measured by an in-plane method of the surface of the ITO film using an X-ray diffractometer (XRD). In the measurement, the range of a diffraction angle ($2\theta$)=15.0 to 70.0° was scanned at a scanning speed of 1°/min. Details of the measurement conditions are described below. A case where the diffraction peak derived from ITO is measured is "d.", and a case where the diffraction peak derived from ITO is not measured is "n.d.".

Measurement Conditions

Apparatus: SmartLab manufactured by Rigaku Corporation
   X-ray source: Cu-Kα ($\lambda$=1.5418 Å) 40 kV 30 mA
   Detector: SC-70
   Step width: 0.04°
   Scan range: 15.0 to 70.0°
   Slit: Incident slit=0.2 mm
   Longitudinal control slit=10 mm
   Receiving slit=20 mm
   The evaluation results are listed in Table 1. Also, FIG. 4 illustrates the influence of a high-temperature and high-humidity environment on the surface resistance value over time in the Examples and Comparative Examples.

TABLE 1

| | Thickness | | | |
| | Transparent coating layer (μm) | | | Transparent conductive layer (nm) |
| | First main surface | Second main surface | Total thickness | |
|---|---|---|---|---|
| Example 1 | 2.0 | — | 2.0 | 40 |
| Example 2 | 1.5 | — | 1.5 | 40 |
| Example 3 | 1.0 | — | 1.0 | 41 |
| Example 4 | 0.4 | 0.4 | 0.8 | 40 |
| Example 5 | 0.7 | 0.7 | 1.4 | 40 |
| Example 6 | 1.0 | 0.9 | 1.9 | 40 |
| Example 7 | 1.9 | 2.1 | 4.0 | 40 |
| Comparative Example 1 | 0.4 | — | 0.4 | 41 |
| Comparative Example 2 | — | — | — | 41 |

| | Initial adhesive force (—) | Linear expansion coefficient ($K^{-1}$) | $R_{250}/R_0$ (—) | $d_{33}$ (pC/N) | ITO diffraction peak |
|---|---|---|---|---|---|
| Example 1 | 5B | $264 \times 10^{-6}$ | 1.10 | 19.4 | n.d. |
| Example 2 | 5B | $298 \times 10^{-6}$ | 1.07 | 19.4 | n.d. |
| Example 3 | 5B | $287 \times 10^{-6}$ | 1.06 | 20.5 | n.d. |
| Example 4 | 5B | $276 \times 10^{-6}$ | 1.16 | 17.0 | n.d. |
| Example 5 | 5B | $256 \times 10^{-6}$ | 1.22 | 16.5 | n.d. |
| Example 6 | 5B | $235 \times 10^{-6}$ | 1.20 | 16.4 | n.d. |
| Example 7 | 5B | $191 \times 10^{-6}$ | 1.19 | 14.6 | n.d. |
| Comparative Example 1 | 4B | $357 \times 10^{-6}$ | 1.57 | 22.9 | n.d. |
| Comparative Example 2 | 5B | $377 \times 10^{-6}$ | 2.42 | 23.6 | n.d. |

Discussion

As is clear from Table 1 and FIG. 4, all of the transparent conductive piezoelectric films of Examples 1 to 7 have sufficiently low $R_{250}/R_0$ and sufficient transparency. It is thought that this is because the transparent conductive piezoelectric film includes the transparent coating layer having a sufficient thickness, and thus thermal shrinkage of the film in a high-temperature and high-humidity environment is suppressed, and occurrence of cracks or peeling of the ITO due to thermal shrinkage can be sufficiently suppressed.

On the other hand, in the transparent conductive piezoelectric films of Comparative Examples 1 and 2, $R_{250}/R_0$ is relatively high. This is thought to be because the transparent piezoelectric film shrunk due to heat, resulting in cracking of the ITO or peeling between the film and ITO.

INDUSTRIAL APPLICABILITY

The present invention can be used in a touch panel.

REFERENCE SIGNS LIST

1 Transparent piezoelectric film
2, 2a, 2b Transparent coating layer
3, 3a, 3b, 3c, 3d Transparent electrode
4a, 4b, 4c Transparent adhesive layer
5 Cover glass
6a, 6b, 6c Transparent substrate
10, 20 Transparent conductive piezoelectric film
30 Display
100 Touch panel

The invention claimed is:

1. A transparent conductive piezoelectric film comprising, by sequentially stacking:
   a transparent piezoelectric film made of a fluororesin;
   a transparent coating layer; and
   a transparent electrode,
   wherein a thickness of the transparent piezoelectric film is from 20 μm to 200 μm,
   a total thickness of the transparent coating layer is 0.6 to 4.5 μm, and
   when the transparent conductive piezoelectric film is left in an environment of 85° C. for 250 hours, a ratio of a surface resistance value after being left in the environment to a surface resistance value before being left in the environment is 1.30 or less.

2. The transparent conductive piezoelectric film according to claim 1,
   wherein a linear expansion coefficient determined by thermomechanical analysis is $310 \times 10^{-6}$ $K^{-1}$ or less.

3. The transparent conductive piezoelectric film according to claim 1,
   wherein the transparent electrode is made of an indium-tin composite oxide, and a peak of the indium-tin composite oxide is not detected in X-ray diffraction.

4. The transparent conductive piezoelectric film according to claim 1,
   wherein the transparent coating layer is made of a (meth) acrylic acid ester resin.

5. A touch panel comprising:
   the transparent conductive piezoelectric film described in claim 1.

6. A method for manufacturing a transparent conductive piezoelectric film comprising:
   a step of forming a transparent coating layer having a total thickness of 0.6 to 4.5 μm on at least one surface of a transparent piezoelectric film made of a fluororesin; and
   a step of forming a transparent electrode,
   wherein, when the transparent conductive piezoelectric film is left in an environment of 85° C. for 250 hours, a ratio of a surface resistance value of the transparent electrode after being left in the environment to a surface resistance value of the transparent electrode before being left in the environment is 1.30 or less.

7. The method for manufacturing a transparent conductive piezoelectric film according to claim 6,
   wherein in the step of forming the transparent electrode, a thin film of an indium-tin composite oxide is formed as the transparent electrode on the transparent coating layer by a reactive sputtering method using a sintered body containing indium oxide and tin oxide as a raw material.

8. The method for manufacturing a transparent conductive piezoelectric film according to claim 7,
   wherein in the step of forming the transparent electrode, reactive sputtering is performed at a temperature of 80° C. or less.

9. The method for manufacturing a transparent conductive piezoelectric film according to claim 7,
   wherein an annealing treatment for the transparent electrode formed in the step of forming the transparent electrode is not performed.

10. The method for manufacturing a transparent conductive piezoelectric film according to claim 6,
   wherein an annealing treatment for the transparent electrode formed in the step of forming the transparent electrode is not performed.

* * * * *